(12) United States Patent
Kim et al.

(10) Patent No.: US 8,431,479 B2
(45) Date of Patent: Apr. 30, 2013

(54) SEMICONDUCTOR DEVICES HAVING REDISTRIBUTION STRUCTURES AND PACKAGES, AND METHODS OF FORMING THE SAME

(75) Inventors: Ki-Hyuk Kim, Yongin-si (KR);
Nam-Seog Kim, Yongin-si (KR);
Hyun-Soo Chung, Hwaseong-si (KR);
Seok-Ho Kim, Bucheon-si (KR);
Myeong-Soon Park, Seoul (KR);
Chang-Woo Shin, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 224 days.

(21) Appl. No.: 12/797,837

(22) Filed: Jun. 10, 2010

(65) Prior Publication Data
US 2011/0104888 A1 May 5, 2011

(30) Foreign Application Priority Data
Oct. 30, 2009 (KR) .......................... 10-2009-0104503

(51) Int. Cl.
*H01L 21/4763* (2006.01)
(52) U.S. Cl.
USPC .................. 438/618; 438/637; 257/E21.577; 257/E21.585
(58) Field of Classification Search .................. 438/618, 438/637; 257/E21.577, E21.585
See application file for complete search history.

(56) References Cited

U.S. PATENT DOCUMENTS
2008/0174025 A1 7/2008 Ryu et al.

FOREIGN PATENT DOCUMENTS
| JP | 2008-066576 | 3/2008 |
|---|---|---|
| KR | 2001-105641 | 11/2001 |
| KR | 10-787894 | 12/2007 |

*Primary Examiner* — Zandra Smith
*Assistant Examiner* — Toniae Thomas
(74) *Attorney, Agent, or Firm* — Stanzione & Kim, LLP

(57) ABSTRACT

Semiconductor devices and methods of forming the same, including forming a chip pad on a chip substrate, forming a passivation layer on the chip pad and the chip substrate, forming a first insulation layer on the passivation layer, forming a recess and a first opening in the first insulation layer, forming a second opening in the passivation layer to correspond to the first opening, forming a redistribution line in a redistribution line area of the recess, the first opening, and the second opening, forming a second insulation layer on the redistribution line and the first insulation layer, and forming an opening in the second insulation to expose a portion of the redistribution line as a redistribution pad.

23 Claims, 11 Drawing Sheets

SEMICONDUCTOR DEVICES HAVING REDISTRIBUTION STRUCTURES AND PACKAGES, AND METHODS OF FORMING THE SAME

CROSS-REFERENCE TO RELATED APPLICATIONS

This application claims the benefit of Korean Patent Application No. 2009-0104503, filed on Oct. 30, 2009 in the Korean Intellectual Property Office, the disclosure of which is incorporated herein by reference in its entirety.

BACKGROUND

1. Field of the Invention

Example embodiments of the present general inventive concept relate to semiconductor devices and methods of forming the same, and, more particularly, to semiconductor devices including redistribution line structure and methods of forming the same.

2. Description of the Related Art

A chip scale package (CSP) is a type of integrated circuit chip carrier. The pads may be etched or printed directly onto the silicon wafer, resulting in a package very close to the size of the silicon die. Such a package is typically called a wafer level chip scale package (WL-CSP) or a wafer level package (WLP). The WL-CSP uses redistribution or rerouting of a bonding pad of a semiconductor chip.

In a semiconductor device fabrication process, the WL-CSP directly redistributes another pad larger in size in place of the bonding pad on the semiconductor chip. An external connection terminal, such as a solder ball or a bonding wire, is formed on the redistribution pad.

The conventional structure of a redistribution layer (RDL) typically includes several layers, such as a first interlayer dielectric, a seed metal deposition, a photoresist pattern, electroplating, a photoresist strip and seed metal etch, and a second interlayer dielectric. The WL-CSPs are typically small in size and light weight. However, the cost of raw materials and the processing costs required in their production are expensive. That is, WL-CSPs are typically more expensive to manufacture than conventional plastic packaging. Forming multiple redistribution layers and forming patterns using a photomask can have high manufacturing costs, which poses problems in mass production of WL-CSPs.

Recently, nano-scale metal particles have been developed, and include materials such as copper, silver, gold, and the like. These nano-scale metal particles can be directly drawn onto a semiconductor wafer by an ink-jet system. By using these nano-scale particles, a desired redistribution layer pattern can be drawn on the wafer by an ink-jet printing method. The redistribution line using the ink-jet method can form a metal line without a photo mask, but has difficulty in forming a very fine metal line on the wafer because the liquid line can be electrically interrupted by the surface condition of an insulation layer that is below the distribution line. It typically takes an increased amount of time to form liquid lines, because the ink-jet dotting on a wafer to form lines is usually repeated several times (such as 4-6 times) in order to form a line of a desired width.

SUMMARY

Example embodiments of the present general inventive concept provide methods of forming a redistribution line on a semiconductor wafer to reduce the number of photo masks and to reduce the cost of production. Example embodiments of the present general inventive concept also provide forming a redistribution line with an ink-jet method to route a metal line with a predetermined fine line width on a semiconductor wafer.

Example embodiments of the present general inventive concept provide methods of forming a redistributed line after forming a recess or trench on a first polymer layer on a completed semiconductor wafer. The recess or trench may be formed using a gray mask that selectively controls the depth of the recess or trench, and may be filled with a conductive material by an ink-jet dotting method or squeezing method.

Additional features and utilities of the present general inventive concept will be set forth in part in the description which follows and, in part, will be obvious from the description, or may be learned by practice of the general inventive concept.

Exemplary embodiments of the present general inventive concept provide a method of forming a semiconductor device, the method including forming a chip pad on a chip substrate, forming a passivation layer on the chip pad and the chip substrate, forming a first insulation layer on the passivation layer, forming a recess and a first opening in the first insulation layer, forming a second opening in the passivation layer aligned vertically with the first opening, forming a redistribution line the recess, the first opening, and the second opening, forming a second insulation layer on the redistribution line and the first insulation layer, and forming an opening in the second insulation to expose a portion of the redistribution line as a redistribution pad.

The forming of the passivation layer of the method may include forming the passivation layer on the chip pad and the chip substrate to have a thickness from a surface of the chip substrate.

The forming of the passivation layer in the method may include forming the passivation layer on the chip pad and the chip substrate to have an external surface spaced apart from a surface of the chip substrate by a distance.

The forming of the first insulation layer in the method may include forming the first insulation layer with a uniform thickness from the passivation layer.

The forming of the recess and the first opening in the first insulation layer in the method may include forming the recess and the first opening using a photo mask.

The method may include that the photo mask is a gray photo mask.

The method may include that the photo mask has at least three portions having different transparency characteristics.

The method may include where the photo mask has a transparent portion, a semi-transparent portion, and an opaque portion.

The forming of the recess and the first opening in the first insulation layer in the method may include forming the recess and the first opening to expose a portion of the passivation layer to correspond to the second opening.

The forming of the recess and the first opening in the first insulation layer in the method may include simultaneously forming the recess and the first opening in the first insulation layer.

The forming of the recess and the first opening in the first insulation layer in the method may include removing a first portion and a second portion from the first insulation layer as the recess and the first opening.

The forming of the recess and the first opening in the first insulation layer in the method may include removing a first thickness and a second thickness from the first insulation layer to form the recess and the opening.

The forming of the recess and the first opening in the first insulation layer may include forming a first trench in the first insulation layer to form the recess, and forming a second trench in the first trench as the opening.

The forming of the recess and the first opening in the first insulation layer in the method may include forming the first insulation layer to have a first layer thickness, forming a first area of the first insulation layer to have a recess thickness, and forming a second area of the first insulation layer to have an opening thickness.

The method may include where the opening thickness is substantially zero.

The method may include where the recess thickness is between the first layer thickness and the opening thickness.

The forming of the recess and the first opening may include forming a first portion in the first insulation layer to have a thickness to correspond to the recess, forming a second portion in the first insulation layer as the first opening through which a portion of the passivation layer is exposed, and forming a third portion in the second different from the first and third portions to correspond to a non redistribution line area.

The method may include where the second opening is formed in the second portion of the first insulation layer.

The forming of the second opening in the passivation layer in the method may include forming a first side wall in the first insulation layer to define the first opening, and forming second side wall in the passivation layer to define the second opening, the first side wall and the second side wall being extended in a same direction.

The forming of the second opening in the passivation layer may include forming a first side wall in the first insulation layer to be substantially perpendicular to a surface direction of the first insulation layer to define the first opening, and forming a second side wall in the passivation layer to be substantially perpendicular to a surface direction of the passivation layer to define the second opening.

The forming of the second opening in the passivation layer in the method may include removing a portion of the passivation to define the second opening to expose at least a portion of the chip pad.

The forming of the second opening in the passivation layer in the method may include forming the second opening through the first opening of the first insulation layer.

The forming of the second opening in the passivation layer in the method may include forming the first opening to have a first area, and forming the second opening to have a second area, the first area and the second area being substantially same.

The forming of the recess and the first opening and the forming of the second opening in the method may include using a first photo mask to form the recess and the first opening, and using a second photo mask to form the second opening, the second photo mask having different transmissivity from the first photo mask.

The forming of the redistribution line in the method may include forming the redistribution line to have a thickness thinner than a thickness of the first insulation layer.

The forming of the redistribution line in the method may include forming the redistribution line to have a thickness less than a height of the recess.

The forming of the redistribution line in the method may include filling a conductive material in the recess, the first opening and the second opening, and curing the conductive material to form the redistribution line.

The forming of the redistribution line in the method may include injecting a conductive material in the recess, the first opening and the second opening, and removing a portion of the injected conductive material extending beyond a surface of the first insulation layer.

The forming of the redistribution line in the method may include disposing a conductive material in the recess, the first opening and the second opening, and shrinking a volume of the conductive material such that a thickness of the conductive material is not higher than the first insulation layer.

The forming of the redistribution line in the method may include forming a conductive material as the redistribution line to have a volume smaller than a volume of the recess, the first opening, and the second opening.

The forming of the redistribution line in the method may include forming a first portion of the redistribution line in the first opening and the second opening, and forming a second portion of the redistribution line in the recess, the second portion disposed perpendicular to the first portion.

The method may include where the first portion of the redistribution line has a cylindrical shape.

The method may include where the second portion of the redistribution line is extended from the first portion in a single direction from the first portion.

The forming of the redistribution line in the method may include forming an internal surface of the redistribution line to correspond to surfaces of the recess, the first opening and the second opening, and forming an external surface of the redistribution line to be parallel to a surface of the chip substrate.

The forming of the redistribution line in the method may include forming an internal surface of the redistribution line to correspond to surfaces of the recess, the first opening and the second opening, and forming an external surface of the redistribution line to be spaced apart from the chip substrate by a same distance.

The forming of the redistribution line in the method may include extending the redistribution line from the chip pad through the first opening and the second opening toward the recess in a single direction.

The forming of the redistribution line in the method may include preventing the redistribution line from being formed in opposite directions from the chip pad.

The forming of the redistribution line in the method may include filling the recess, the first opening, and the second opening with a conductive material including a solvent.

The method may include where the solvent is evaporated from the conductive material such that the conductive material is reduced in volume.

The forming of the redistribution line in the method may include forming a first conductive material to have a first dimension the recess, the first opening, and the second opening, and forming the first conductive material as a second conductive material having a second dimension within the structure.

The forming of the redistribution line in the method may include forming a first conductive material having one or more first components in a structure of the recess, the first opening, and the second opening, and forming a second conductive material having one or more second components from the first conductive material, as the conductive line.

The method may include where the number of the one or more first components is greater than the number of the one or more second components.

The method may include where at least one component is common in the one or more first components and the one or more second components.

The method may include where the conductive line has a selected first height, the first insulation layer has a second height, and the second height is longer than the first height of the conductive line with respect to the substrate.

The method may include where the first insulation layer is not formed on the conductive line.

Exemplary embodiments of the present general inventive concept may also provide a method of forming a semiconductor device, the method including forming a chip pad on a portion of a chip substrate, forming a passivation layer on the chip pad and the chip substrate, forming a first insulation layer on the passivation layer, forming a recess and a first opening in the first insulation layer using a first photo mask, forming a second opening in the passivation layer through the first opening using a second photo mask, injecting a conductive material in a structure of the recess, the first opening, and the second opening to form a conductive line, forming a second insulation layer on the redistribution line and the first insulation layer, and forming an opening in the second insulation to expose a portion of the redistribution line as a redistribution pad.

Exemplary embodiments of the present general inventive concept may also provide a method of forming a semiconductor device, including forming a chip pad on a portion of a chip substrate, forming a passivation layer on the chip pad and the chip substrate, forming a first insulation layer on the passivation layer, forming a structure in the first insulation layer and the passivation layer, forming a conductive line in the structure such that a volume of the conductive line is smaller than a volume of the structure, forming a second insulation layer on the redistribution line and the first insulation layer, and forming an opening in the second insulation to expose a portion of the redistribution line as a redistribution pad.

Exemplary embodiments of the present general inventive concept may also provide a semiconductor device, including a chip substrate disposed with a chip pad thereon, a passivation layer disposed on the chip pad and the chip substrate, a first insulation layer disposed on the passivation layer, a recess and a first opening disposed in the first insulation layer, a second opening disposed in the passivation layer through the first opening, a redistribution line disposed in the recess, the first opening, and the second opening, a second insulation layer formed on the redistribution line and the first insulation layer, and an opening disposed in the second insulation to expose a portion of the redistribution line as a redistribution pad.

Exemplary embodiments of the present general inventive concept may also provide a semiconductor device, including a chip substrate formed with a chip pad thereon, a passivation layer formed on the chip pad and the chip substrate, a first insulation layer formed on the passivation layer, a recess and a first opening formed in the first insulation layer using a first photo mask, a second opening formed in the passivation layer through the first opening using a second photo mask, a conductive material injected in a structure of the recess, the first opening, and the second opening to form a conductive line, a second insulation layer formed on the redistribution line and the first insulation layer, and an opening formed in the second insulation to expose a portion of the redistribution line as a redistribution pad.

Exemplary embodiments of the present general inventive concept may also provide a semiconductor device, including a substrate formed with a chip pad thereon, a passivation layer formed on the chip pad and the chip substrate, a first insulation layer formed on the passivation layer, a structure formed in the first insulation layer and the passivation layer, a conductive line formed in the structure such that a volume of the conductive line is smaller than a volume of the structure, a second insulation layer formed on the redistribution line and the first insulation layer, and an opening formed in the second insulation to expose a portion of the redistribution line as a redistribution pad.

Exemplary embodiments of the present general inventive concept may also provide a method of forming a semiconductor device, the method including forming a chip substrate and a chip pad formed thereon, forming a layer on the chip substrate and the chip pad, forming a recess structure in the layer, and filling a conductive material to form a redistribution line in the recess structure to electrically connect the chip pad to a location other than the chip pad.

Exemplary embodiments of the present general inventive concept may also provide a semiconductor device including a chip substrate and a chip pad formed thereon, a layer formed on the chip substrate and the chip pad, a recess structure formed in the layer, and a conductive material filled in the recess structure to form a redistribution line in the recess structure to electrically connect the chip pad to a location other than the chip pad.

The recess structure of the semiconductor device may include a side wall to define an opening to expose the chip pad, and the side wall is perpendicular to the chip pad.

The recess structure of the semiconductor device may include a side wall to define an opening to expose the chip pad, and the redistribution line comprises a portion formed in the opening to be perpendicular to the chip pad.

The recess structure of the semiconductor device may include a side wall to define an opening to expose the chip pad, and the side wall is vertical with respect to a center line of the opening.

The recess structure of the semiconductor device may include an opening disposed in a first direction from the chip pad, and a recess extended from the opening in a second direction parallel to the chip substrate.

The conductive material of the semiconductor device may include a volume different from a volume of the distribution line.

The semiconductor device may include the layer having a thickness different from the distribution line.

Exemplary embodiments of the present general inventive concept also provide a method of forming a semiconductor device, the method including forming a chip pad on a chip substrate, forming a passivation layer on the chip pad and the chip substrate, forming a first insulation layer on the passivation layer, forming a recess and a first opening in the first insulation layer, the first opening defined by a first wall and a second wall that are parallel, with a first distance being a distance between the first wall and the second wall, forming a second opening in the passivation layer to correspond to the first opening, the second opening defined by a third wall and a fourth wall that are parallel, with a second distance as the distance between the third wall and the fourth wall, forming a redistribution line in a redistribution line area of the recess, the first opening, and the second opening, forming a second insulation layer on the redistribution line and the first insulation layer, and forming an opening in the second insulation to expose a portion of the redistribution line as a redistribution pad.

The method may also include where the forming of the second opening includes the second distance equal to the first distance.

Exemplary embodiments of the present general inventive concept also provide a method of forming a semiconductor device, the method including forming a chip pad on a chip substrate, forming a passivation layer on the chip pad and the chip substrate, forming a first insulation layer on the passivation layer, forming a recess and a first opening with a first size in the first insulation layer, forming a second opening with a second size in the passivation layer to correspond to the first opening, forming a redistribution line in a redistribution line area of the recess, the first opening, and the second opening, the redistribution line having a length that is greater than the first size of the first opening and the second size of the second opening, forming a second insulation layer on the redistribution line and the first insulation layer, and forming an opening in the second insulation to expose a portion of the redistribution line as a redistribution pad.

BRIEF DESCRIPTION OF THE DRAWINGS

Example embodiments of the present general inventive concepts can be understood in more detail from the following description taken in conjunction with the accompanying drawings, in which.

DETAILED DESCRIPTION OF THE EMBODIMENTS

Figure 1:
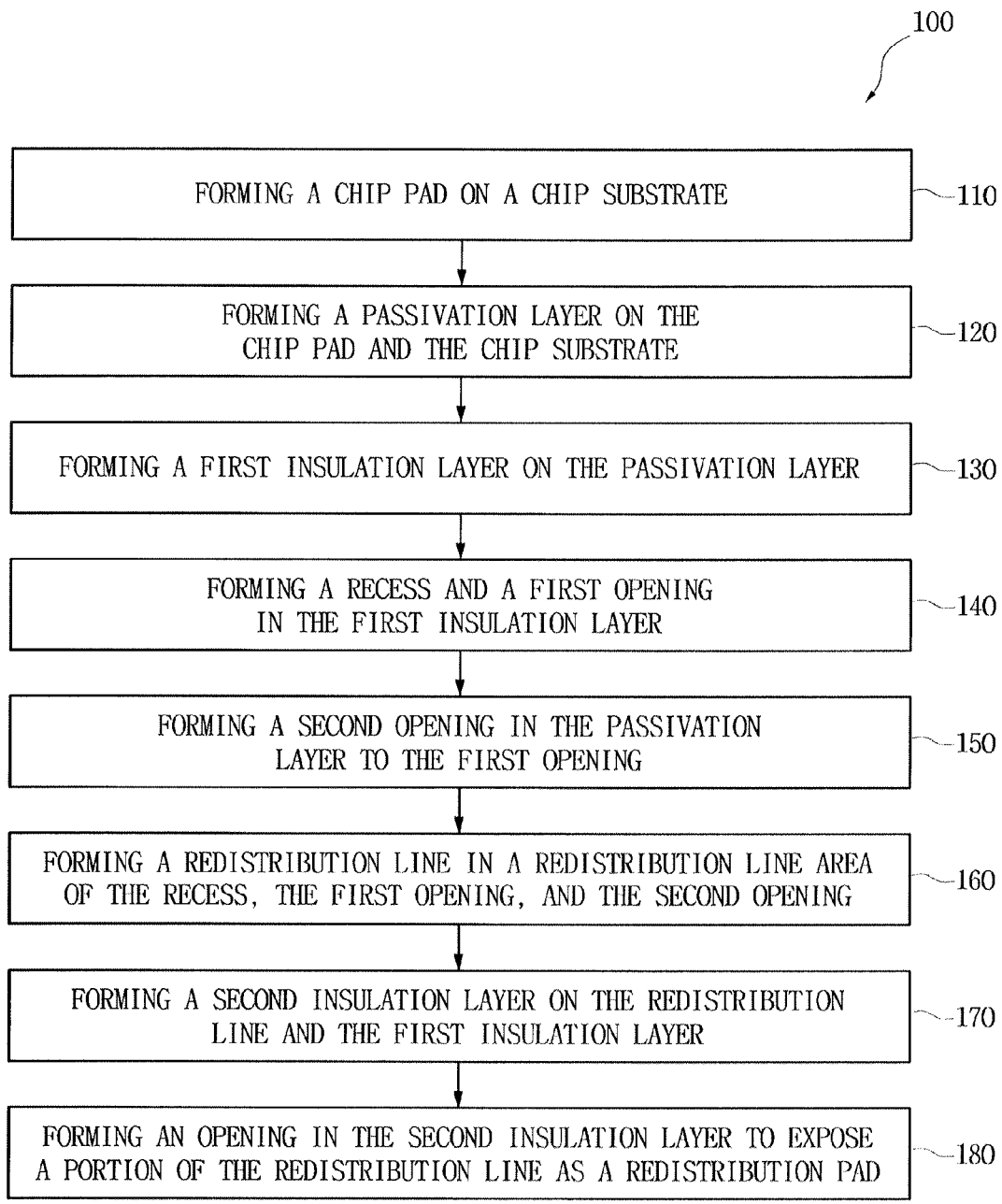
FIG. 1 illustrates an exemplary method of forming a semiconductor device according to exemplary embodiments of the present general inventive concept.

Example embodiments of the inventive concept are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present general inventive concept are described herein with reference to cross-sectional illustrations that are schematic illustrations of illustratively idealized example embodiments (and intermediate structures) of the present general inventive concept. As such, variations from the shapes of the illustrations as a result, for example, of manufacturing techniques and/or tolerances, are to be expected. Thus, example embodiments of the present general inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1-10 illustrate exemplary methods of forming a semiconductor device according to exemplary embodiments of the present general inventive concept. These figures and methods will be described in detail below.

Figure 2:
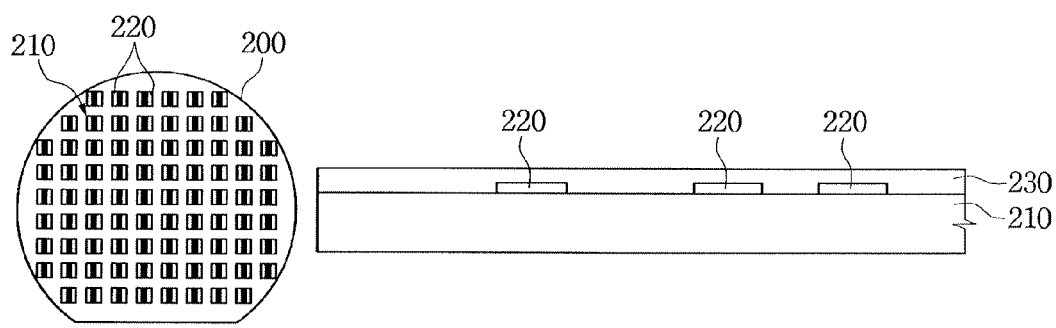
FIG. 2 illustrates forming a plurality of chip pads and a passivation layer on a chip substrate according to exemplary embodiments of the present general inventive concept.

At operation 110 of method 100 illustrated in FIG. 1, at least one chip pad may be formed on a chip substrate. As illustrated in FIG. 2, a semiconductor wafer 200 may include a chip substrate 210 (where the chip substrate may also be referred to as a chip), and chip pads 220. At operation 110, one or more semiconductor chip pads 220 may be formed on each chip substrate 210 on wafer 200. A passivation layer 230 may be formed on the chip substrate 210 and at least one of the chip pads 220 at operation 120. The passivation layer 230 may cover the active surface of the semiconductor chip 210 to protect the semiconductor chip 210 from stresses that may be inflicted during a redistribution process of fabricating a WL-CSP. The passivation layer 230 may include an inorganic substance, for example, silicon dioxide (SiO$_2$), silicon nitride (SiN), and silicon oxynitride (SiON).

Figure 3:
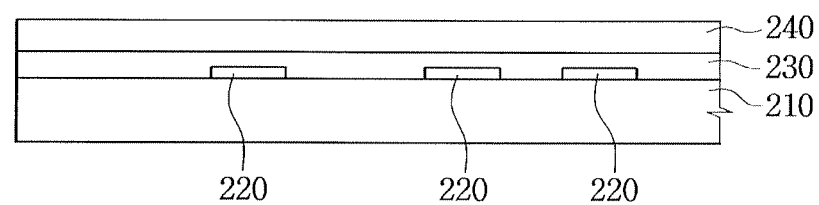
FIG. 3 illustrates forming a first insulation layer on the passivation layer on a semiconductor device according to exemplary embodiments of the present general inventive concept.

At operation 130, a first insulation layer may be formed on the passivation layer (e.g., the passivation layer 230). FIG. 3 illustrates a first insulation layer 240 that may be formed on the passivation layer 230. The first insulation layer 240 may be polymer-based, and, for example, may be a photo-sensitive polyimide (PSPI). If the first insulation layer 240 is a polymer-based layer, it may include at least one of epoxy, polyimide, benzocyclobutene (BCB), or polybenzoxazole (PBO). The first insulation layer 240 may have a thickness that is greater than or equal to that of the passivation layer 230.

Figure 4:
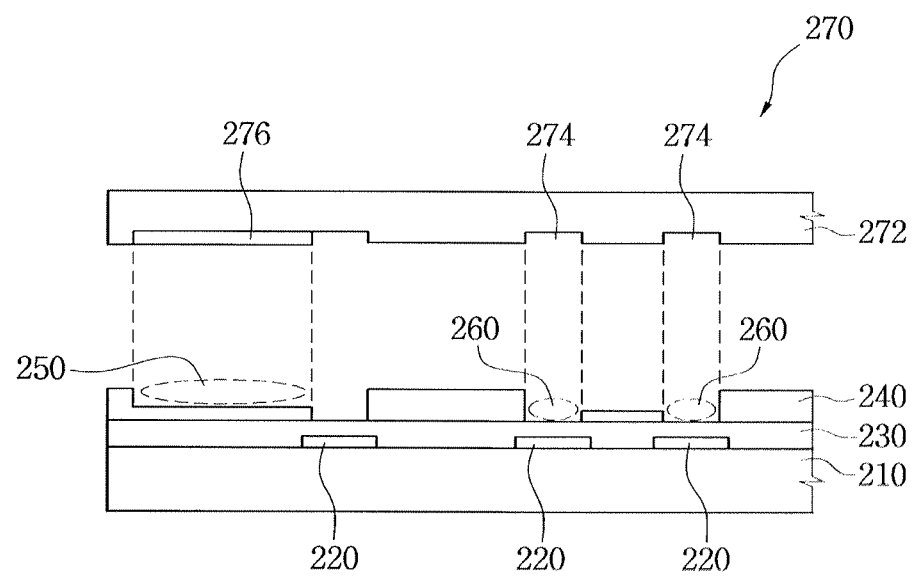
FIG. 4 illustrates forming a recess and a first opening using a gray photo mask on a semiconductor device according to exemplary embodiments of the present general inventive concept.

At operation 140, a recess (i.e., "trench") and a first opening may be formed in the first insulation layer. FIG. 4 illustrates a recess portion 250 and a first opening portion 260 that may be formed in the first insulation layer with a gray photo mask 270. The gray photo mask 270 may be a mask that has a desired pattern provided on a given material (e.g., gray photo mask 270 may be formed on a glass substrate 272) described by the transmission of light and may be used to project light onto wafers or substrates. The gray photo mask 270 may be made using any number of materials using a technique to alter the transmission of the material to be multi-level or gray-level. The gray photo mask 270 may have, for example, different portions, where each portion may have a different transmissivity. For example, the gray photo mask 270 may have three different portions, with a first portion being transparent, and second portion being semi-transparent, and a third portion being opaque. As illustrated in FIG. 4, gray photo mask 270 may have transparent portion 274 and semi-transparent portion 276, and the other portions of the glass substrate 272 of the gray photo mask 270 may be opaque. The semi-transparent portion 276 may be an area to form the recess portion 250 during operation 140. Further details regarding the method of forming a recess portion in an insulation layer are described in U.S. Patent Application Pub. No. 2008/0174025, assigned to the assignee of the present invention, and hereby incorporated by reference in their entirety.

Figure 5:
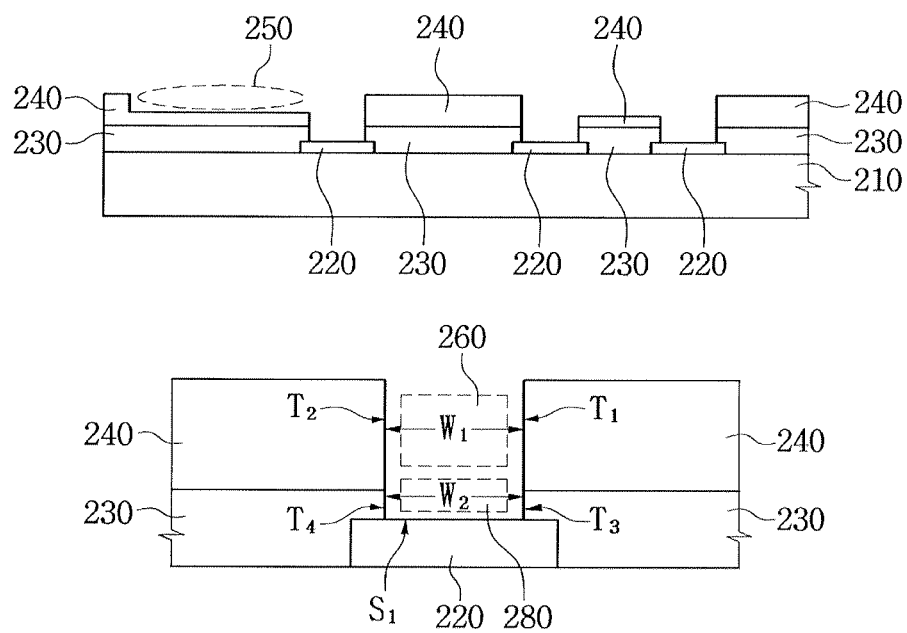
FIG. 5 illustrates forming a second opening and exposing at least a portion of a chip pad of a semiconductor device according to exemplary embodiments of the present general inventive concept.

A second opening can be formed in the passivation layer to correspond to the first opening at operation 150 illustrated in FIG. 1. FIG. 5 illustrates that to expose a portion of the surface of chip pad 220, portions of the passivation layer 230 that vertically align with the chip pad 220 may be patterned to form the second opening portion 280. The second opening portion 280 may be arranged to vertically align with the first opening portion 260, as illustrated in FIG. 5. That is, the first opening portion 260 may be formed in the first insulation layer 240, as illustrated in FIGS. 4 and 5, and the second opening portion 280 may be formed in the passivation layer 280, as illustrated in FIG. 5, so as to expose a surface of the chip pad 220.

As illustrated in FIG. 5, the first opening portion 260 may be defined by sides T1 and T2, and may have a width W1, and the second opening portion may be defined by sides T3 and T4. In exemplary embodiments of the present general inventive concept, W1 may be approximately equal to W2. Sides T1 and T2 may be parallel or about parallel with one another, and each side may be perpendicular or about perpendicular with surface S1 of the chip pad 220. Sides T3 and T4 may be parallel or about parallel with one another, and each side may be perpendicular or about perpendicular with surface S1 of the chip pad 220. Sides T1 and T2 may be formed from at least a portion of the first insulation layer 240, or may be formed from at least a portion of the first insulation layer 240 and at least a portion of the passivation layer 230. Sides T3 and T4 may be formed from at least a portion of the passivation layer 230, or may be formed from at least a portion of the passivation layer 230 and at least a portion of the first insulation layer 240.

Figure 6:
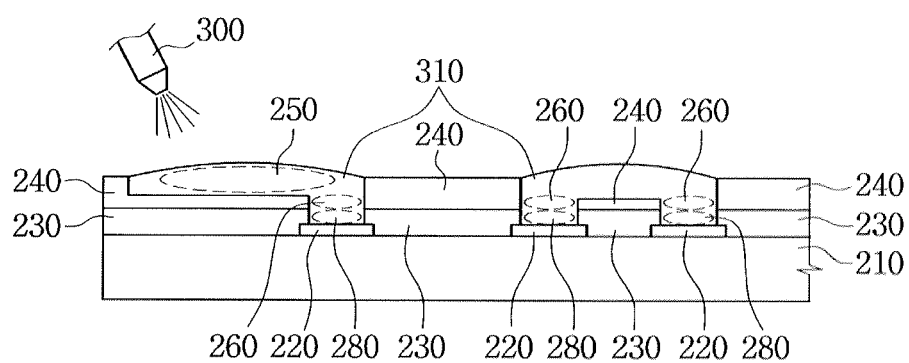
FIGS. 6 and 7 illustrate forming a redistribution line of the semiconductor device according to exemplary embodiments of the present general inventive concept.

Turning again to FIG. 1, a redistribution line may be formed in a redistribution line area of the recess, the first opening, and the second opening at operation 160. As illustrated in FIG. 6, at least one nozzle 300 may dispose a conductive material 310 into at least the recess portion 250 and the first opening portion 260 and the second opening portion 280. The nozzle 300 may use an ink-jet method to fill the recess portion 250 and the first opening portion 260 and the second opening portion 280 with the conductive material. The ink-jet method may include, among other things, jetting, dispersing, dotting, or shooting the conductive material 310 into the recess portion 250 and the first opening portion 260 and the second opening portion 280.

The conductive material 310 may be, for example, a colloid-like suspension or emulsion, and the ease at which the conductive material 310 may be jetted, disperse, or shot may be increased if the conductive material 310 is a liquid or is in a liquid-like state. The conductive material 310 may include conductive particles, which may be metal or metallic compounds. When the conductive material 310 is disposed into at least the recess portion 250 and the first opening portion 260 and the second opening portion 280, the conductive material 310 may have a curved shape on its surface opposite the chip pads 220, because of surface tension.

Figure 7:
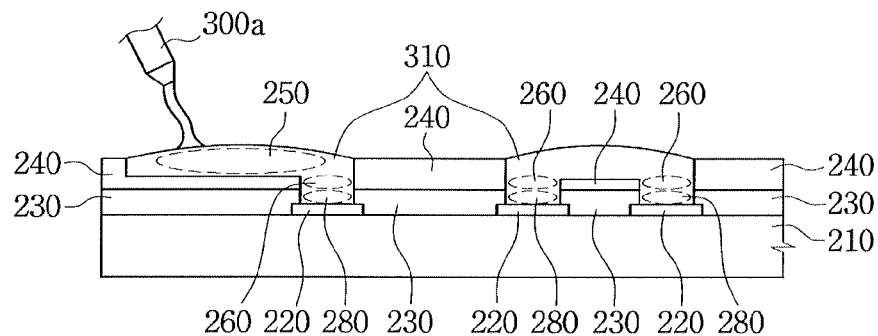
Figure 7:
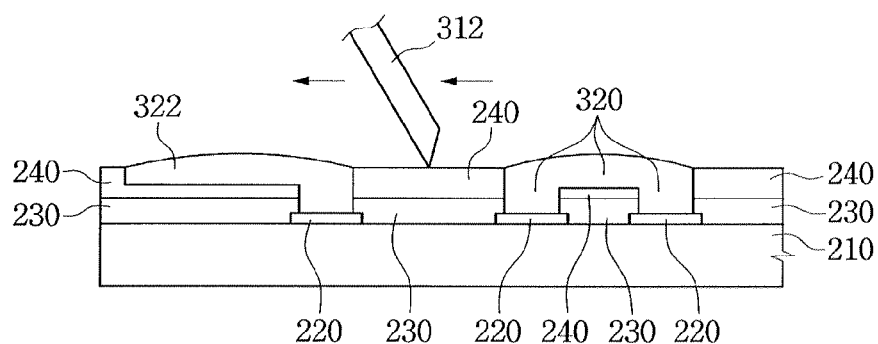

The forming the redistribution line at operation 160 may also be illustrated in FIG. 7, which illustrates that the conductive material 310 may be dispensed by dispenser 300a by a squeezing method, where the recess portion 250, the first opening portion 260, and the second opening portion 280 may be filled with conductive material 310. The conductive material 310 may be a gel having a predetermined viscosity, and the conductive material 310 may be disposed and/or scattered on all or part of the surface of the wafer 210. As illustrated in FIG. 7, a blade 312 may remove at least a portion of the conductive material 310 disposed and/or scattered on the surface of the wafer 210. For example, as illustrated in FIG. 7, recess portion 250, the first opening portion 260, and the second opening portion 280 that is filled with conductive material 310 may have a curved surface shape due to surface tension. The blade 312 may remove at least a portion of the curved surface (e.g., as illustrated in portion 322 of FIG. 7) from the disposed conductive material 310. That is, FIG. 7 illustrates region 320 where the blade 312 has removed at least a portion of the conductive material 310 (e.g., the curved portion extending in a direction above the first insulation layer 240), and portion 322 illustrates a curved portion of the conductive material 310 to be removed by the blade 312.

Figure 8:
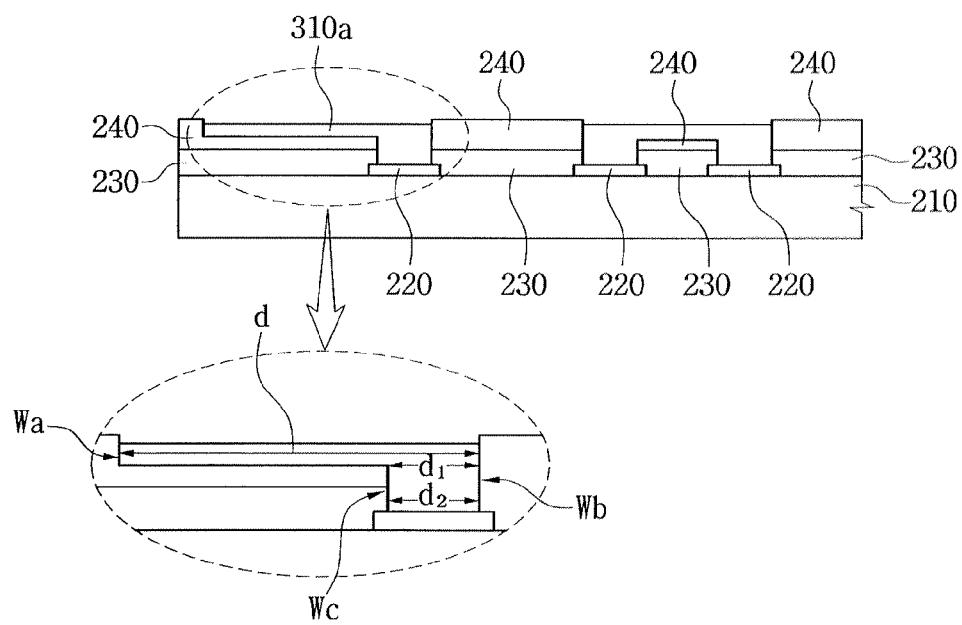
FIG. 8 illustrates curing or sintering the conductive material of the semiconductor device according to exemplary embodiments of the present general inventive concept.

Turning to FIG. 8, the conductive material 310 may be cured or sintered to form a redistribution line 310a and to evaporate a solvent. That is, the solvent may be evaporated by heating the conductive material, along with the chip substrate 210, in an oven or other suitable heating device. For example, the conductive material 310 may be cured or sintered at by heating the conductive material 310 at about 100-150° C. As illustrated in FIG. 8, the volume of the conductive material 310 may be shrink to form the redistribution line 310a, as the solvent has been evaporated. That is, a surface of the redistribution line 310a may be at a different level than the first insulation layer 240 (i.e., the surface of the redistribution line 310a may be lower than a surface of the first insulation layer 240 such that the surfaces are not on or about the same plane).

FIG. 8 illustrates that the redistribution line 310a may have a length of (d) between walls Wa and Wb. The walls Wa and Wb may be formed from at least a portion of the first insulation layer 240, or from at least a portion of the first insulation layer 240 and at least a portion of the passivation layer 230. The walls Wa and Wb may be parallel or about parallel with one another. The redistribution line 310a may have a length of (d1) between the walls Wb and Wc. The walls Wb and Wc may be formed from at least a portion of the first insulation layer 240, or from at least a portion of the first insulation layer 240 and at least a portion of the passivation layer 230, or from at least a portion of the passivation layer 230. The walls Wb and Wc may be parallel or about parallel to one another. The redistribution line 310a may have a length of (d2) between the walls Wb and Wc. In exemplary embodiments of the present general inventive concept, the lengths (d1) and (d2) may be the same or about the same.

Figure 9:
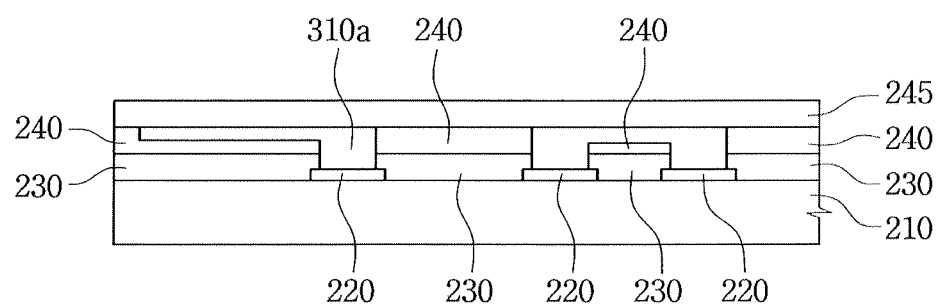
FIG. 9 illustrates forming a second insulation layer on the semiconductor device according to exemplary embodiments of the present general inventive concept.

Referring to FIG. 1, a second insulation layer can be formed on the redistribution line and the first insulation layer at operation 170. As illustrated in FIG. 9, a second insulation layer 245 is disposed and/or formed on the first insulation layer 240 and the redistribution line 310a. The second insulation layer 245 may protect the redistribution lines 310a from physical and/or chemical damage, and/or minimize any physical or chemical damage.

Figure 10:
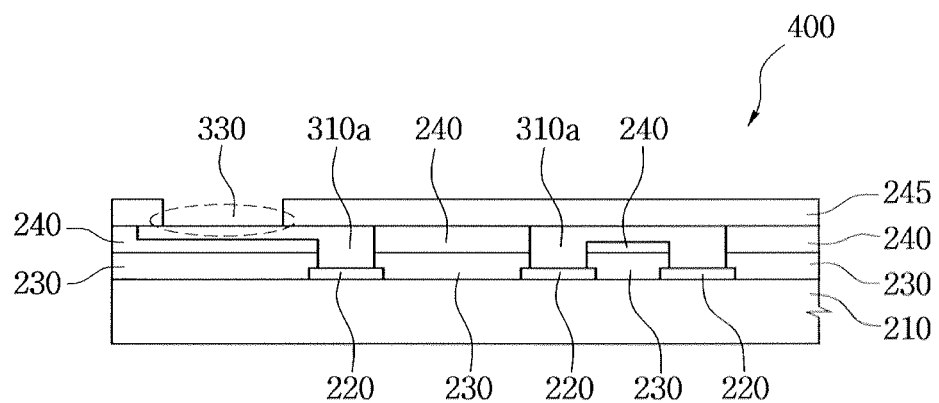
FIG. 10 illustrates forming a redistribution pad opening in the second insulation layer in the semiconductor device accord to exemplary embodiments of the present general inventive concept.

An opening may be formed in the second insulation layer to expose a portion of the redistribution line as a redistribution pad at operation 180 illustrated in FIG. 1. FIG. 10 illustrates that a redistribution pad 330 is formed in the second insulation layer 245. A solder ball land of a wafer level package or a wire bonding pad of a package may be affixed to the redistribution pad 330.

Figure 11:
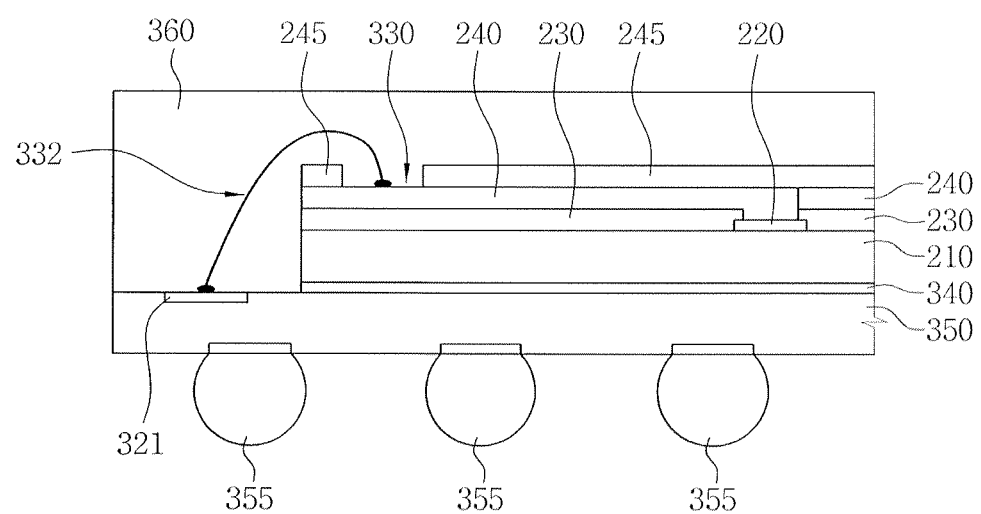
FIG. 11 illustrates a ball grid array package that includes a chip having a redistribution pad according to exemplary embodiments of the present general inventive concept.

FIG. 11 illustrates a ball grid array package 400 that includes a chip 210 having a redistribution pad 330. The ball grid array package 400 includes a package substrate 350, where one or more solder balls 355 are affixed to a first surface of the package substrate 250. An adhesive 340 is disposed between a second surface of the package substrate 350 and the chip substrate 210. One end of a bonding wire 332 can be attached to the redistribution pad 330, and another end of the bonding wire 332 can be attached to a bonding finger 334, where the bonding finger 334 is formed on the package substrate 350. An epoxy mold compound (EMC) 360 may be formed on the second insulation layer 245 and the package substrate 350.

When a semiconductor chip, such as semiconductor chip 210 (e.g., illustrated in FIG. 2), has pads (e.g., chip pads 220) that are generally centered on the chip, it is typically not necessary to form an edge pad to bond a wire to, as redistribution pads (e.g., redistribution pads 330) can receive the wires to be bonded.

Figure 12:
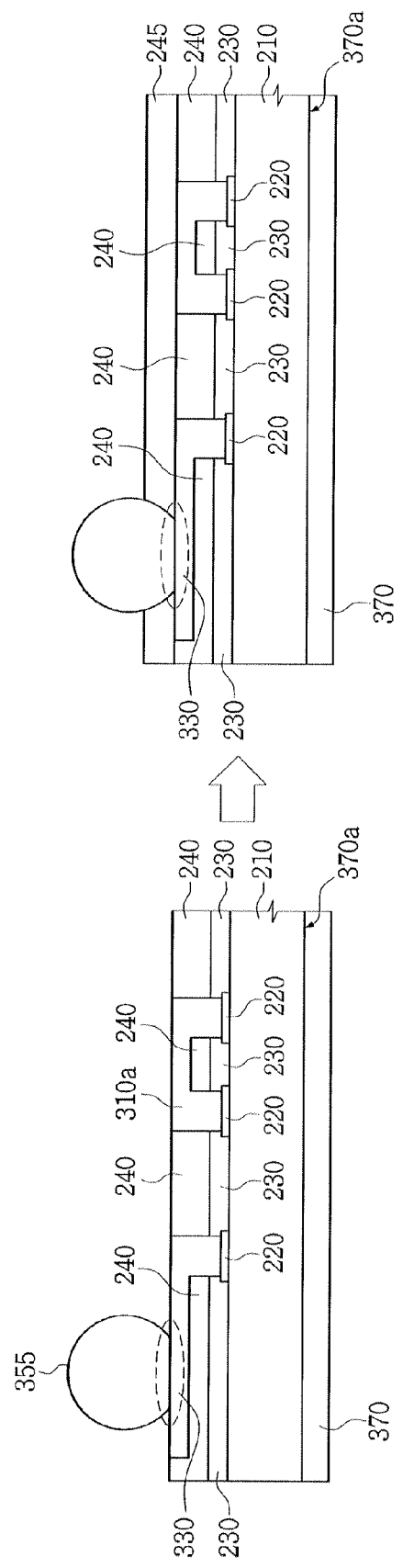
FIG. 12 illustrates a wafer level package according to exemplary embodiments of the present general inventive concept, where a redistribution pad may receive a solder ball land in a wafer level package, without a printed circuit board (PCB) substrate.

FIG. 12 illustrates a wafer level package according to exemplary embodiments of the present general inventive concept, where a redistribution pad may receive a solder ball land in a wafer level package, without a printed circuit board (PCB) substrate. After a solder ball 355 is formed on a redistribution pad 330, the second insulation layer 245 is formed on the redistribution line 310a and first insulation layer 240. The second insulation layer 245 may be a polymer layer, epoxy molding compound, or other suitable substance to protect at least a portion of the solder ball 355 and the redistribution line 310a from chemical and/or physical damage. A back side film 370 may be deposited on a back surface 370a of chip substrate 210.

Figure 13:
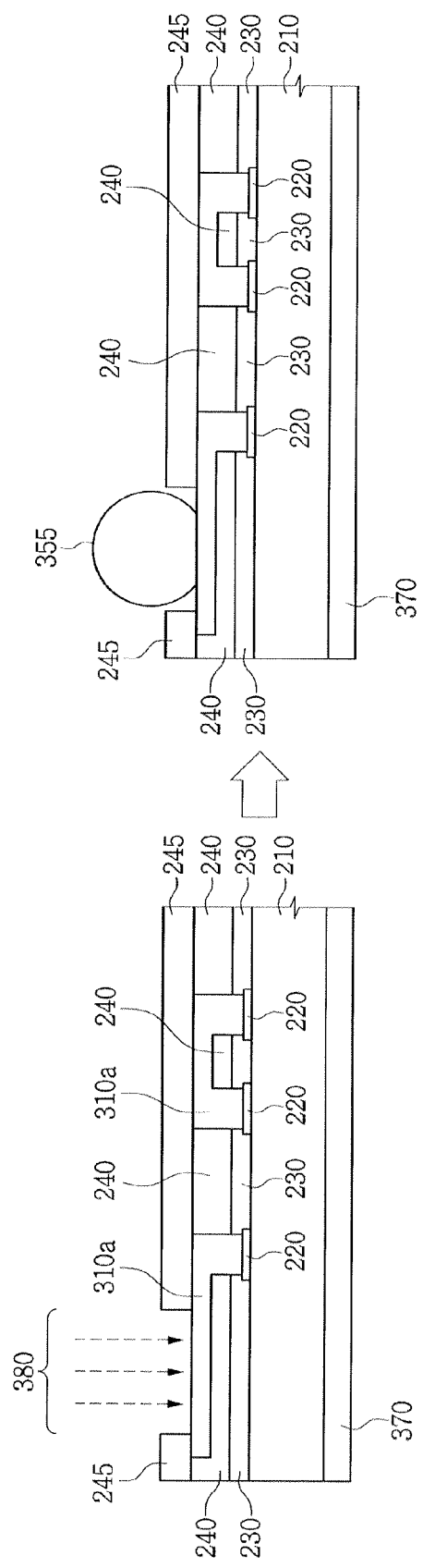
FIG. 13 illustrates a wafer level package according to exemplary embodiments of the present general inventive concept.

FIG. 13 illustrates a wafer level package according to exemplary embodiments of the present general inventive concept. As illustrated in FIG. 13, after the second insulation layer 245 is formed on the redistribution line 310a and the first insulation layer 240, an opening 380 is formed in the second insulation layer 245 and a redistribution pad 330 is exposed. For example, the opening 380 may be formed by a laser beam or may be formed in any other suitable manner. That is, a through mold via (i.e., the opening 380 may be formed to the redistribution pad 300 through the second insulation layer 245) may be formed with the laser beam, such that a method of using a mask to form the opening 380 to the redistribution pad 330 does not have be used.

Figure 14:
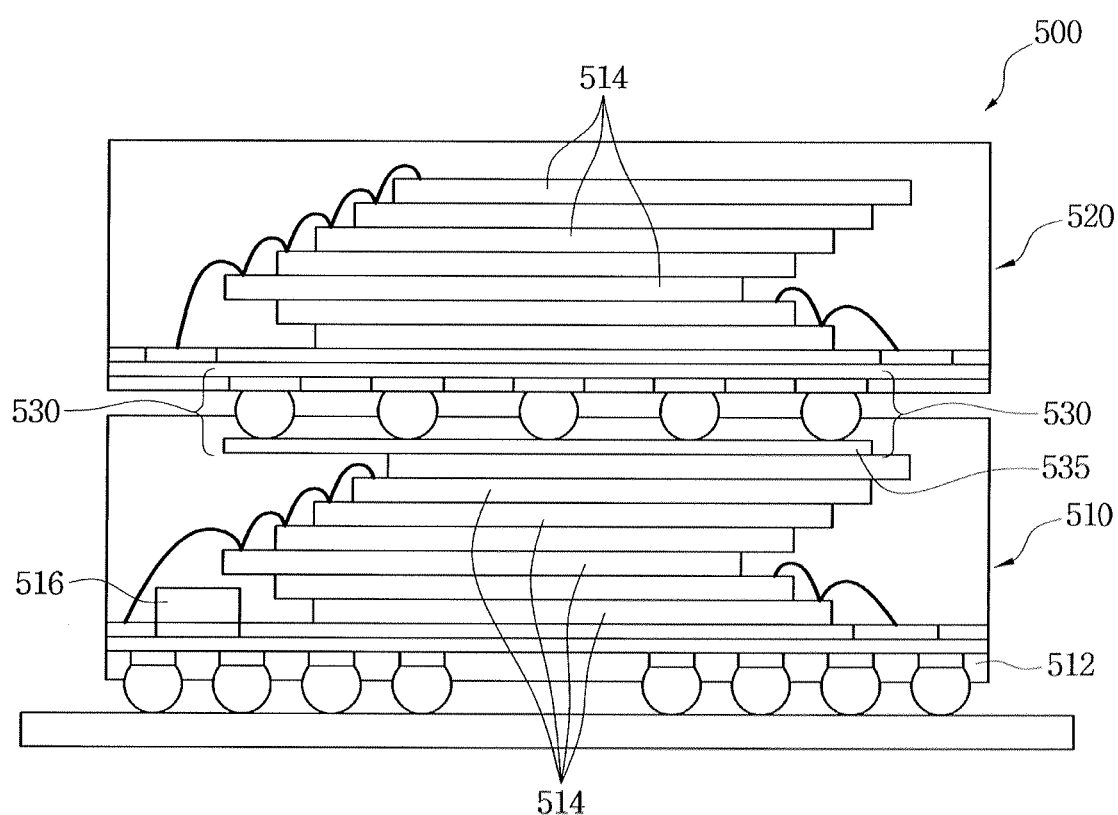
FIG. 14 illustrates a fan-in package-on-package (POP) according to exemplary embodiments of the present general inventive concept.

FIG. 14 illustrates a fan-in package-on-package (POP) according to exemplary embodiments of the present general inventive concept. As illustrated in FIG. 14, fan-in POP 500 may include a first package 510 that may have a package substrate 512, with one or more memory chips 514 and a memory control 516 disposed on the package substrate 512. The memory controller 516 may control, among other things, reading data from and writing data to the one or more memory chips 514. A second package 520 that is similar to or the same as the first package 510 may be disposed on and coupled to the first package 510 with a solder ball joint 530. The solder ball joint 530 may be coupled to a redistribution pad 535 of the first package 510. The redistribution pad 535 may be similar to or the same as the redistribution pad 330 that is illustrated, for example, in FIGS. 11-13 and described above. In the fan-in POP 500, the interconnection between the first package 510 and the second package 520 may be formed by the methods described above in connection with FIGS. 11-13. A memory chip in the plurality of memory chips 514 that is closest to the solder ball joint 530 may have a redistribution line and redistribution pad (e.g., similar to or the same as redistribution line 310a and redistribution pad 330 as described above) so as to connect to the solder ball joint 530 and to the second package 520.

Figure 15:
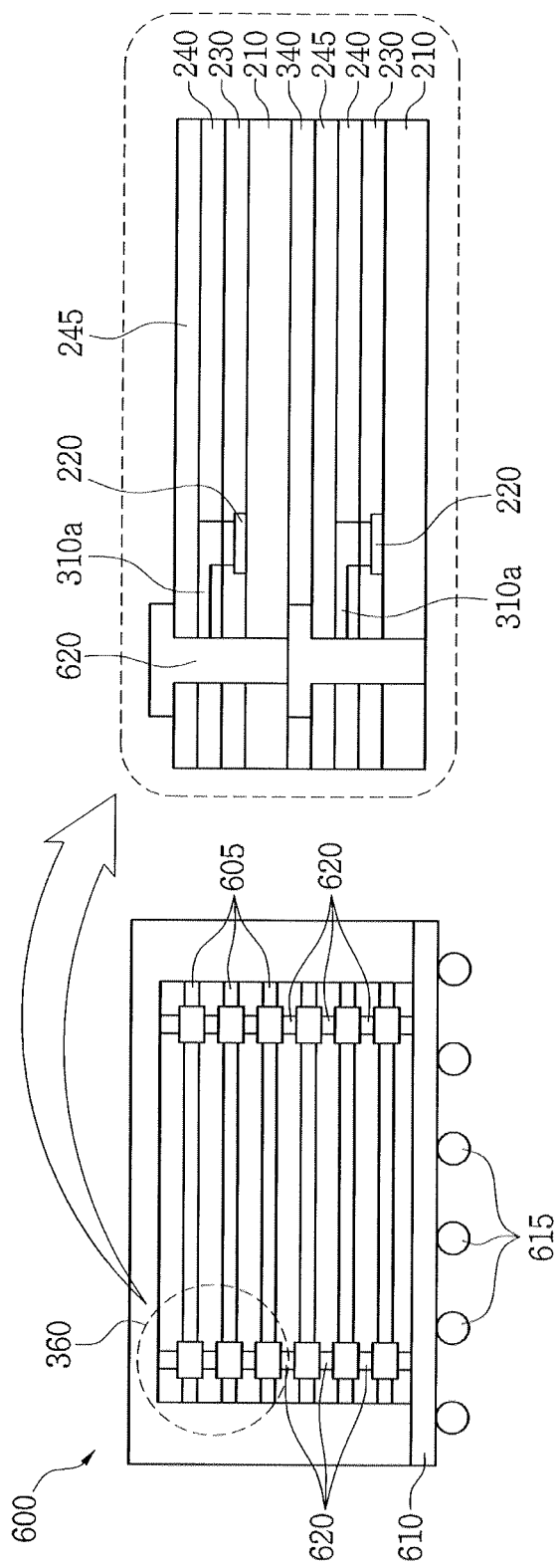
FIG. 15 illustrates a wafer stack package according to exemplary embodiments of the present general inventive concept.

FIG. 15 illustrates a wafer stack package according to exemplary embodiments of the present general inventive concept. As illustrated in FIG. 15, a wafer stack package 600 may include a package substrate and one or more solder balls 615 disposed on a surface of the package substrate 610. The wafer stack package 600 may include a plurality of chips 605 stacked on the package substrate 610, with each chip including a redistribution line 310a that is electrically connected to a through silicon via (TSV) 620 and a chip pad 220. That is, the redistribution line 310a, the chip pad 220, and the TSV 620 may be electrically interconnected with one another. The chips that are stacked in the wafer stack package 600 may include a chip substrate 210, a chip pad 220, a passivation layer 230, a first insulation layer 240, a second insulation layer 245, and a redistribution line 310a as at least described above in connection with FIGS. 2-11. As illustrated in FIG. 15, an adhesive 340 may connect stacked chips together with one another, and an epoxy mold compound 360 may be disposed on the stacked chips.

The foregoing is illustrative of example embodiments, and is not to be construed as limiting thereof. Although several example embodiments have been described, those skilled in the art will readily appreciate that many modifications are possible in the example embodiments without materially departing from the novel teachings and advantages of example embodiments. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A method of forming a semiconductor device, the method comprising:
    forming a chip pad on a chip substrate;
    forming a passivation layer on the chip pad and the chip substrate;
    forming a first insulation layer on the passivation layer;
    forming a recess and a first opening in the first insulation layer using a photo mask having at least three portions having different transparency characteristics;
    forming a second opening in the passivation layer aligned vertically with the first opening;
    forming a redistribution line in the recess, the first opening, and the second opening;
    forming a second insulation layer on the redistribution line and the first insulation layer; and
    forming an opening in the second insulation to expose a portion of the redistribution line as a redistribution pad.

2. The method of claim 1, wherein the photo mask includes a gray photo mask.

3. The method of claim 1, wherein the at least three portions of the photo mask comprise a transparent portion, a semi-transparent portion, and an opaque portion.

4. The method of claim 1, wherein forming the recess and the first opening in the first insulation layer comprises:
    forming the recess and the first opening to expose a portion of the passivation layer to correspond to the second opening.

5. The method of claim 1, wherein forming the recess and the first opening in the first insulation layer comprises:
    simultaneously forming the recess and the first opening in the first insulation layer.

6. The method of claim 1, wherein forming the recess and the first opening in the first insulation layer comprises:
    removing a first portion and a second portion from the first insulation layer.

7. The method of claim 1, wherein forming the recess and the first opening comprises:
    forming a first portion in the first insulation layer to have a thickness to correspond to the recess;
    forming a second portion in the first insulation layer as the first opening through which a portion of the passivation layer is exposed; and
    forming a third portion in the second different from the first and third portions to correspond to a non redistribution line area.

8. The method of claim 7, wherein the second opening is formed in the second portion of the first insulation layer.

9. The method of claim 1, wherein forming the second opening in the passivation layer comprises:
    forming a first side wall in the first insulation layer to define the first opening; and
    forming a second side wall in the passivation layer to define the second opening, the first side wall and the second side wall being extended in a same direction.

10. The method of claim 1, wherein forming the second opening in the passivation layer comprises:
    forming a first side wall in the first insulation layer to be substantially perpendicular to a surface direction of the first insulation layer to define the first opening; and
    forming a second side wall in the passivation layer to be substantially perpendicular to a surface direction of the passivation layer to define the second opening.

11. The method of claim 1, wherein forming the second opening in the passivation layer comprises:
    removing a portion of the passivation layer to define the second opening to expose at least a portion of the chip pad.

12. The method of claim 1, wherein forming the second opening in the passivation layer comprises:
    forming the first opening to have a first area; and
    forming the second opening to have a second area, the first area and the second area being substantially same.

13. The method of claim 1, wherein forming the recess, the first opening and the second opening comprises:
    using a first photo mask to form the recess and the first opening; and
    using a second photo mask to form the second opening, the second photo mask having different transmissivity from the first photo mask.

14. The method of claim 1, wherein forming the redistribution line comprises:

forming the redistribution line to have a thickness less than a height of the recess.

15. The method of claim 1, wherein forming the redistribution line comprises:
filling a conductive material in the recess, the first opening and the second opening; and
curing the conductive material to form the redistribution line.

16. The method of claim 1, wherein forming the redistribution line comprises:
injecting a conductive material in the recess, the first opening and the second opening; and
removing a portion of the injected conductive material extending beyond a surface of the first insulation layer.

17. The method of claim 1, wherein forming the redistribution line comprises:
disposing a conductive material in the recess, the first opening and the second opening; and
shrinking a volume of the conductive material such that a thickness of the conductive material is not higher than the first insulation layer.

18. The method of claim 1, wherein forming the redistribution line comprises:
forming a conductive material as the redistribution line to have a volume smaller than a volume of the recess, the first opening, and the second opening.

19. The method of claim 1, wherein forming the redistribution line comprises:
filling the recess, the first opening, and the second opening with a conductive material including a solvent.

20. The method of claim 19, wherein the solvent is evaporated from the conductive material such that the conductive material is reduced in volume.

21. The method of claim 1, wherein:
the conductive line has a selected first height;
the first insulation layer has a second height; and
the second height is longer than the first height of the conductive line with respect to the substrate.

22. A method of forming a semiconductor device, the method comprising:
forming a chip pad on a chip substrate;
forming a passivation layer on the chip pad and the chip substrate;
forming a first insulation layer on the passivation layer;
forming a recess and a first opening in the first insulation layer using a photo mask;
forming a second opening in the passivation layer aligned vertically with the first opening;
forming a redistribution line in the recess, the first opening, and the second opening;
forming a second insulation layer on the redistribution line and the first insulation layer; and
forming an opening in the second insulation to expose a portion of the redistribution line as a redistribution pad,
wherein forming the second opening in the passivation layer comprises:
forming the second opening through the first opening of the first insulation layer.

23. A method of forming a semiconductor device, the method comprising:
forming a chip pad on a chip substrate;
forming a passivation layer on the chip pad and the chip substrate;
forming a first insulation layer on the passivation layer;
forming a recess and a first opening in the first insulation layer using a photo mask;
forming a second opening in the passivation layer aligned vertically with the first opening;
forming a redistribution line in the recess, the first opening, and the second opening;
forming a second insulation layer on the redistribution line and the first insulation layer; and
forming an opening in the second insulation to expose a portion of the redistribution line as a redistribution pad,
wherein forming the redistribution line comprises:
forming the redistribution line to have a thickness thinner than a thickness of the first insulation layer.

* * * * *